(12) United States Patent
Chen

(10) Patent No.: US 6,414,846 B1
(45) Date of Patent: Jul. 2, 2002

(54) HEAT SINK ASSEMBLY

(75) Inventor: Chun-Chi Chen, Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/801,314

(22) Filed: Mar. 7, 2001

(30) Foreign Application Priority Data

Feb. 20, 2001 (TW) .................................. 0 90 202 57

(51) Int. Cl.[7] .................................................. H05K 7/20
(52) U.S. Cl. ........................ 361/704; 24/458; 24/625; 165/80.3; 165/185; 174/16.3; 248/510; 257/719; 257/726; 361/710
(58) Field of Search ........................ 24/457–458, 573, 24/625; 165/80.2, 80.3, 185; 174/16.3; 248/505, 510; 257/706–707, 712–713, 718–719, 726–727; 361/690, 697, 704, 707, 709–710, 715, 719–720

(56) References Cited

U.S. PATENT DOCUMENTS

| | | | | |
|---|---|---|---|---|
| 4,716,494 A | * | 12/1987 | Bright et al. | 361/704 |
| 5,251,101 A | * | 10/1993 | Liu | 248/510 |
| 5,448,449 A | * | 9/1995 | Bright et al. | 361/704 |
| 6,205,026 B1 | * | 3/2001 | Wong et al. | 361/704 |
| 6,250,375 B1 | * | 6/2001 | Lee et al. | 165/80.3 |

* cited by examiner

Primary Examiner—Gregory Thompson
(74) Attorney, Agent, or Firm—Wei Te Chung

(57) ABSTRACT

A heat sink assembly includes a heat sink (10) and a fixing device (20). The heat sink includes a base (12) and a plurality of fins (14) extending from the base. The base has a pair of exposed portions at opposite sides of the fins. The fixing device includes a clip (22) and a clamp (24). The clip includes a pair of spaced pressing portions (222) and a pair of engaging loops (228). The clamp has a body (242) with a pair of apertures (244) defined therein. The apertures engagingly receive the engaging loops of the clip, so that the clamp is secured to the clip. The pressing portions are received between fins of the heat sink. The clamp is located over one exposed portion of the heat sink. The pressing portions press the heat sink against an electronic device (50).

14 Claims, 3 Drawing Sheets

HEAT SINK ASSEMBLY

BACKGROUND OF THE INVENTION

1. Field of the Invention

The present invention relates to a heat sink assembly, and particularly to a heat sink assembly which can be easily and firmly secured to an electronic device.

2. Description of Related Art

Many electronic devices generate a lot of heat during normal operation. The heat must be quickly removed to avoid instability or damage being caused to the device. Generally, a heat sink is mounted on a top surface of the electronic device, for removing heat therefrom. Various fixing devices are used to mount the heat sink to the electronic device.

Electronic devices are becoming more and more powerful, and generating more and more heat. Larger and larger heat sinks are being manufactured to meet increasing demands for dissipation of ever-increasing amounts of heat. Therefore, a pair of fixing devices is commonly used on opposite sides of the heat sink. The fixing devices engage with retention modules, to firmly attach the heat sink to the electronic device.

Unfortunately, this kind of conventional assembly requires repeated installation of the fixing devices. This is unduly inconvenient and time-consuming. Furthermore, a pressing point of each fixing device, which acts on the heat sink, usually does not coincide with a center of the fixing device. Therefore, an eccentric moment can occur between the pressing point and the center of the fixing device. This can result in the heat sink dislodging from the electronic device when the assembly is subjected to shock or vibration during normal operation.

Thus, an improved fixing device which overcomes the above-mentioned problems is strongly desired.

SUMMARY OF THE INVENTION

Accordingly, an object of the present invention is to provide a heat sink assembly which is easily and firmly secured to an electronic device.

In order to achieve the object set out above, a heat sink assembly includes a heat sink and a fixing device. The heat sink comprises a base and a plurality of fins extending from the base. The base has a pair of exposed portions at opposite sides of the fins. The fixing device comprises a clip and a clamp. The clip comprises a pair of spaced pressing portions and a pair of engaging loops. The clamp has a body with a pair of apertures defined therein. The apertures engagingly receive the engaging loops of the clip, so that the clamp is secured to the clip. The pressing portions are received between fins of the heat sink. The clamp is located over one exposed portion of the heat sink. The pressing portions press the heat sink against an electronic device.

Other objects, advantages and novel features of the invention will become more apparent from the following detailed description when taken in conjunction with the accompanying drawings.

DETAILED DESCRIPTION OF THE INVENTION

Figure 1:
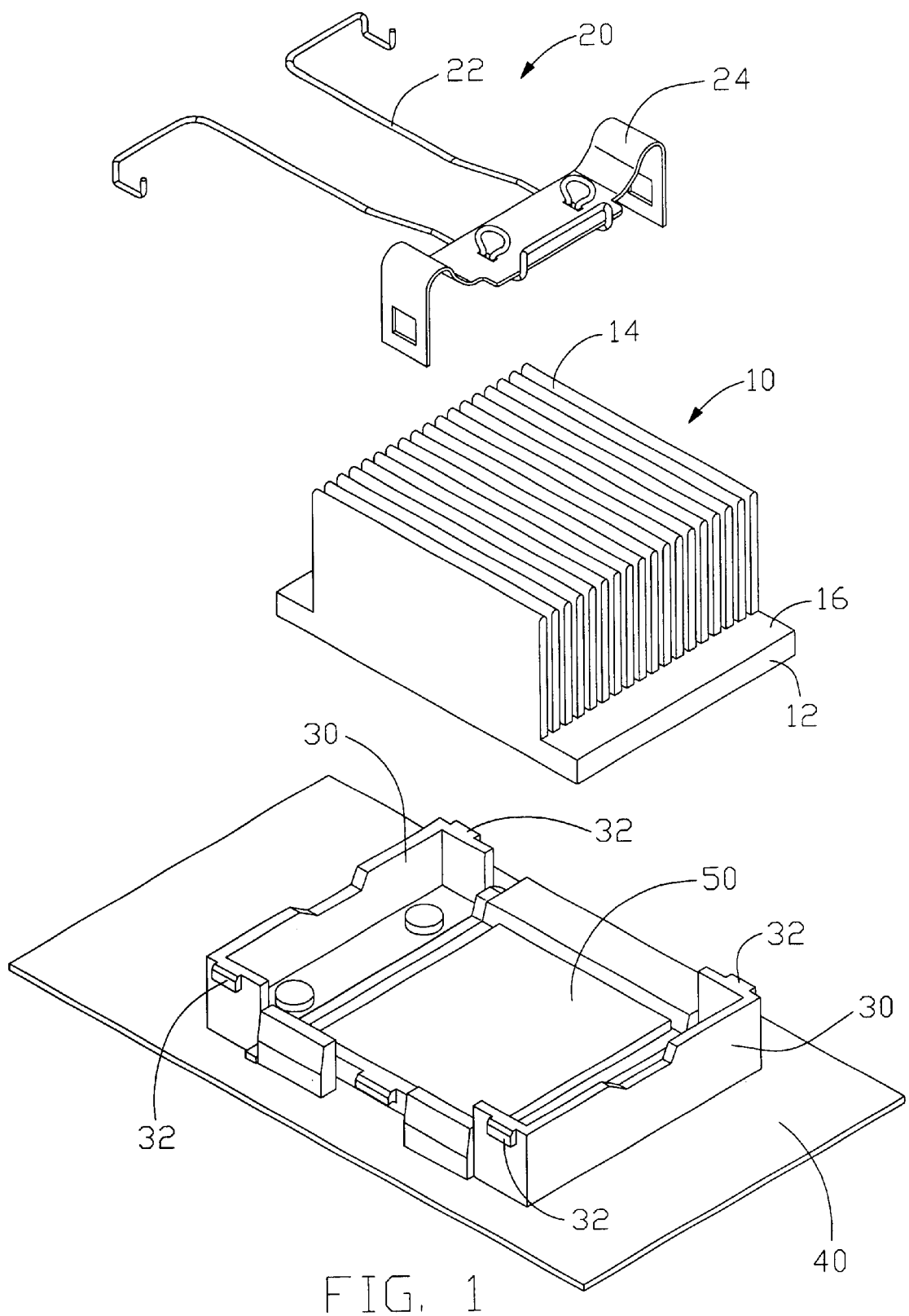
FIG. 1 is an exploded view of a heat sink assembly of the present invention, for use with an electronic device mounted on a printed circuit board between a pair of retention modules.

Reference will now be made to the drawing figures to describe a preferred embodiment of the present invention in detail.

Referring to FIG. 1, a heat sink assembly of the present invention comprises a heat sink 10 and a fixing device 20 for securing the heat sink 10 to an electronic device 50. The electronic device 50 is supported on a printed circuit board (PCB) 40. A pair of retention modules 30 is placed on the PCB 40 at opposite sides of the electronic device 50 respectively. Each retention module 30 has a pair of external ears 32 at opposite ends thereof respectively.

The heat sink 10 has a base 12, and a plurality of fins 14 extending upwardly from a top surface 16 of the base 12. A pair of exposed portions (not labeled) of the base 12 is defined at opposite sides of and adjacent to the fins 14.

The fixing device 20 comprises a clip 22 and a clamp 24 engaging with the clip 22. The clip 22 is bent from an elongated metal rod.

Figure 2:
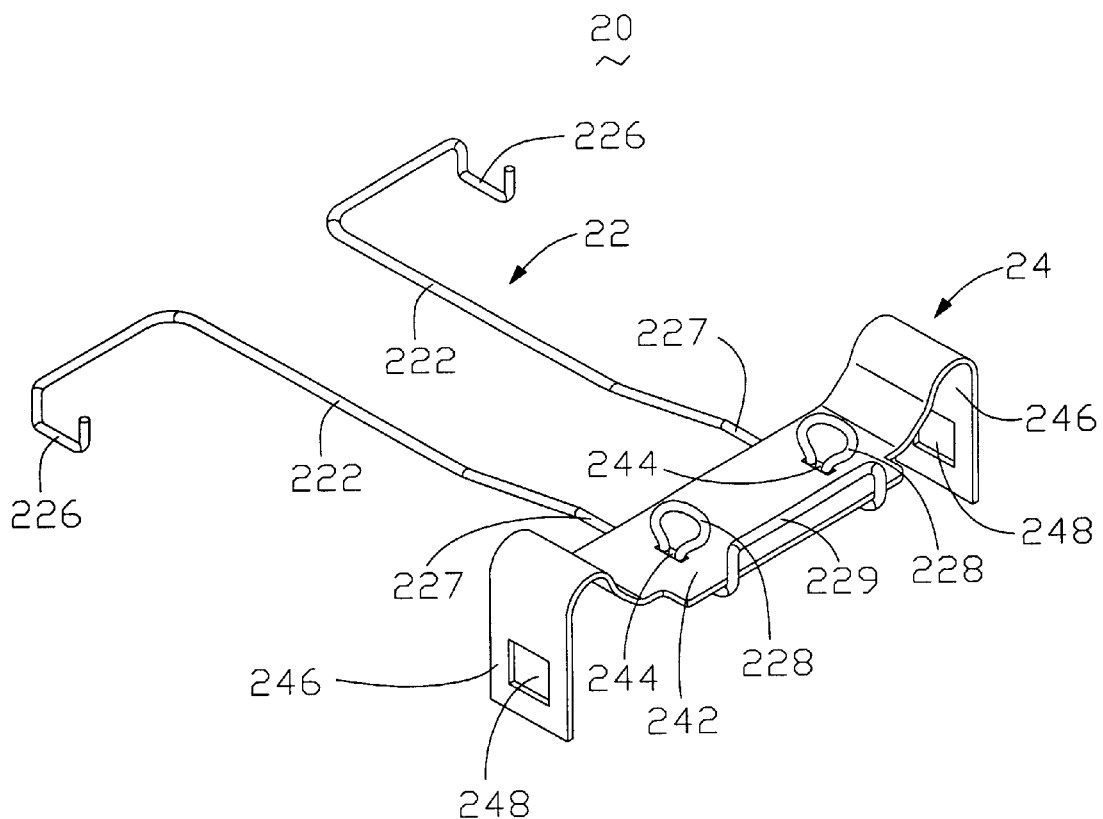
FIG. 2 is a perspective view of a fixing device of the heat sink assembly of FIG. 1.

Referring particularly to FIG. 2, the clip 20 comprises a pair of pressing portions 222, a pair of catches 226, a pair of resilient portions 227, and an operating portion 229. The pressing portions 222 are parallel to and spaced from each other. Each pressing portion 222 is horizontal, for pressing the top surface 16 of the heat sink 10. Each catch 226 extends outwardly from an end of the corresponding pressing portion 222, for receiving the corresponding ear 32 of the corresponding retention module 30. Each resilient portion 227 extends slightly upwardly from an opposite end of the corresponding pressing portion 222. Each resilient portion 227 has a generally vertical engaging loop 228. The operating portion 229 is formed between the resilient portions 227, and has a generally inverted U-shape.

The clamp 24 comprises a body 242, and a pair of legs 246 depending from opposite ends of the body 242 respectively. Each leg 246 defines an opening 248 therein, for receiving the corresponding ear 32 of the corresponding retention module 30. The body 242 defines a pair of spaced apertures 244 therein.

In pre-assembly, the apertures 244 of the clamp 24 engagingly receive the engaging loops 228 of the clip 22 therein. The clip 22 and the clamp 24 are thereby connected together to form the fixing device 20. The operating portion 229 is adjacent an outer side of the body 242 of the clamp 24.

Figure 3:
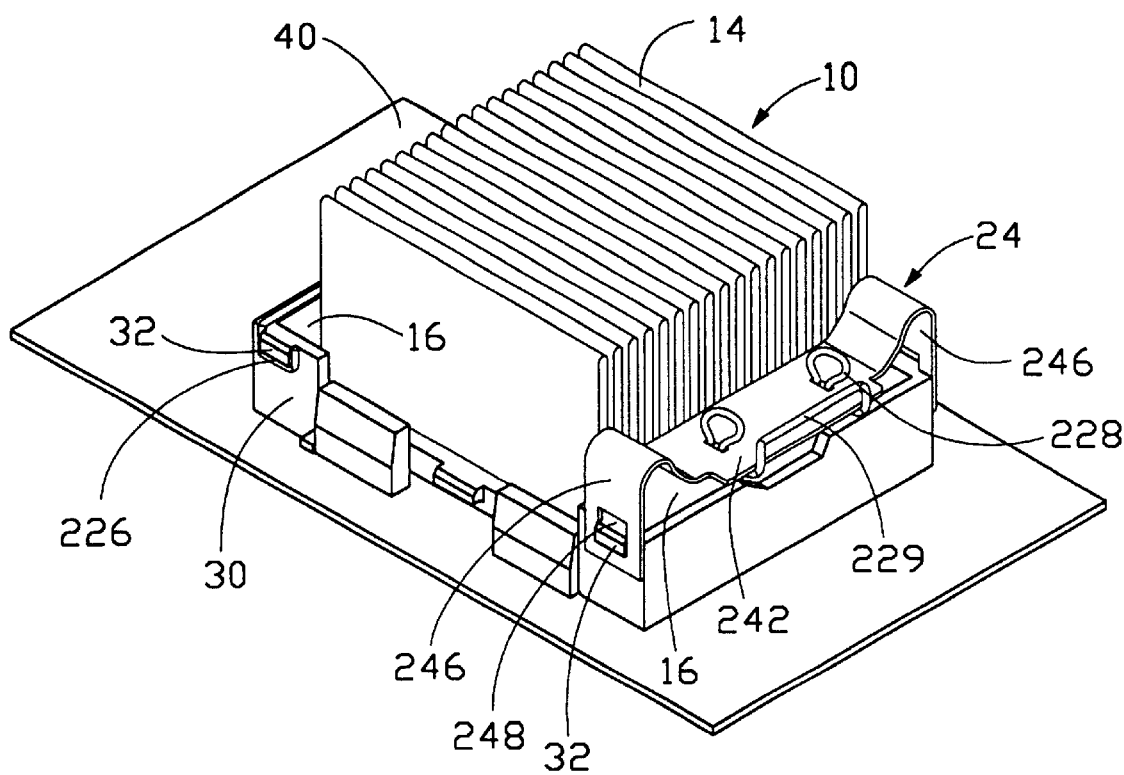
FIG. 3 is an assembled view of FIG. 1.

Referring to FIGS. 1–3, in assembly, the heat sink 10 is placed on the electronic device 50 supported on the PCB 40. The base 12 of heat sink 10 is received in a space (not labeled) defined by the retention modules 30. The top surface 16 of the heat sink 10 is substantially coplanar with top surfaces of the retention modules 30. The fixing device 20 is placed on the heat sink 10, with the pressing portions 222 and parts of the resilient portions 227 received between fins 14 of the heat sink 10. The catches 226 of the clip 22 capture the ears 32 of the corresponding retention module 30. The body 242 of the clamp 24 is located over one exposed portion of the base 12 of the heat sink 20. The operating portion 229 is then pressed downwardly, thus causing the clamp 24 to also move downwardly. When the openings 248 of the clamp 24 receive the ears 32 of the corresponding retention module 30, the clamp 24 springs part of the way back upwardly due to resilience of the resilient portions 227. Thus, the pressing portions 222 of the clip 22 firmly secure the heat sink 10 against the top surface of the electronic device 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:

a heat sink comprising a base and a plurality of fins extending from the base, the base having at least one exposed portion adjacent the fins; and a fixing device comprising a clip received between fins of the heat sink and a clamp located over the at least one exposed portion of the heat sink, the clip having a plurality of spaced pressing portions adapted for pressing the heat sink against an electronic device, and having at least one engaging portion, the clamp comprising a body with at least one void defined therein, the at least one void engagingly receiving the at least one engaging portion of the clip so that the clamp is secured to the clip; wherein the clip further comprises a plurality of catches, each catch extending from a corresponding pressing portion, the clamp further comprising a pair of legs depending from opposite ends of the body, each leg defining an opening, the catches and the openings adapted for engaging with corresponding retention modules for securing the heat sink to the electronic device.

2. The heat sink assembly as described in claim 1, wherein the pressing portions are parallel to each other and horizontal.

3. The heat sink assembly as described in claim 1, wherein the at least one engaging portion is generally a loop.

4. The heat sink assembly as described in claim 1, wherein the at least one engaging portion is generally perpendicular to the clip.

5. The heat sink assembly as described in claim 1, wherein the clip further comprises a plurality of resilient portions extending from the pressing portions, at least one of the resilient portions having the at least one engaging portion.

6. The heat sink assembly as described in claim 5, wherein the clip further comprises at least one operating portion adapted for facilitating pressing of the heat sink against the electronic device.

7. The heat sink assembly as described in claim 6, wherein the at least one operating portion connects at least two of the resilient portions.

8. The heat sink assembly as described in claim 6, wherein the at least one operating portion is adjacent an outer edge of the body of the clamp.

9. The heat sink assembly as described in claim 1, wherein the clip is bent from a metal rod.

10. A heat sink assembly comprising:

a pair of retention modules;

a PCB supporting the retention modules thereon;

an electronic device supported on the PCB and surrounded by the retention modules;

a heat sink having a plurality of fins; and a fixing device comprising a pair of pressing portions, a pair of catches extending outwardly from respective pressing portions, and a pair of legs, each leg defining an opening, the pressing portions being received between fins of the heat sink and being adapted for pressing the heat sink against the electronic device, the catches and the openings respectively engaging with the retention modules, the fixing device thereby securing the heat sink against the electronic device.

11. A fixing device for securing a heat sink to an electronic device, comprising:

a clip having a pair of pressing portions, a catch and a resilient portion extending from respective opposite ends of each of the pressing portions, the catches engaging with a retention module, at least one of the resilient portions having an engaging portion, the clip further having an operating portion between the resilient portions; and a clamp comprising a body and a pair of legs depending from the body, the body defining at least one void for engagingly receiving the engaging portion of the clip therein;

wherein when the operating portion is pressed, the clamp moves downwardly and the legs engage with another retention module, thereby securing the heat sink to the electronic device.

12. The fixing device as described in claim 11, wherein the operating portion is adjacent an outer edge of the body of the clamp.

13. The fixing device as described in claim 11, wherein the operating portion has a generally inverted U-shape.

14. The fixing device as described in claim 11, wherein the engaging portion is generally a loop.

* * * * *